United States Patent
Park

(10) Patent No.: US 8,692,225 B2
(45) Date of Patent: Apr. 8, 2014

(54) RESISTIVE MEMORY DEVICE AND FABRICATION METHOD THEREOF

(75) Inventor: Nam Kyun Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/601,819

(22) Filed: Aug. 31, 2012

(65) Prior Publication Data

US 2013/0313504 A1 Nov. 28, 2013

(30) Foreign Application Priority Data

May 24, 2012 (KR) .................. 10-2012-0055454

(51) Int. Cl.
*H01L 29/06* (2006.01)

(52) U.S. Cl.
USPC . 257/5; 257/2; 257/1; 257/469; 257/E45.002; 438/54

(58) Field of Classification Search
None
See application file for complete search history.

(56) References Cited

U.S. PATENT DOCUMENTS

| | | | |
|---|---|---|---|
| 2003/0001242 A1* | 1/2003 | Lowrey et al. | 257/646 |
| 2007/0099377 A1* | 5/2007 | Happ et al. | 438/257 |
| 2008/0185568 A1* | 8/2008 | Kwon et al. | 257/2 |
| 2009/0046498 A1* | 2/2009 | Philipp et al. | 365/163 |
| 2010/0034016 A1* | 2/2010 | Liu | 365/163 |

FOREIGN PATENT DOCUMENTS

| | | |
|---|---|---|
| KR | 1020090015783 | 2/2009 |
| KR | 1020110121386 | 11/2011 |

* cited by examiner

*Primary Examiner* — Julio J Maldonado
*Assistant Examiner* — Molly Reida
(74) *Attorney, Agent, or Firm* — IP & T Group LLP

(57) ABSTRACT

A resistive memory device capable of suppressing disturbance between cells and a fabrication method thereof are provided. The resistive memory device includes a word line formed, in a first direction, on a semiconductor substrate, lower access structures, each having a pillar shape, formed on the word line, a first insulating layer formed around an outer circumference of each of the lower access structures, a heat-absorption layer formed on a surface of each of the to heat-absorption layers, a variable resistive material formed on the lower access structures, and an upper electrode formed on each variable resistive material.

22 Claims, 7 Drawing Sheets

RESISTIVE MEMORY DEVICE AND FABRICATION METHOD THEREOF

CROSS-REFERENCES TO RELATED APPLICATION

This application claims priority under 35 U.S.C. 119(a) to Korean application number 10-2012-0055454, filed on May 24, 2012, in the Korean Patent Office, which is incorporated by reference in its entirety.

BACKGROUND OF THE INVENTION

1. Technical Field

The inventive concept relates to a semiconductor device, and more particularly, to a resistive memory device and a fabrication method thereof.

2. Related Art

As typical next-generation memories that replace dynamic random access memories (DRAMs) or flash memories, resistive memory devices have received attentions. The resistive memory devices are memory devices using a variable resistive material that is switched between at least two different resistance states by rapidly changing resistance according to an applied voltage.

As an example of the resistive memories, there are phase-change random access memories (PCRAMs). The PCRAM generally includes a switching element, a lower electrode formed on the switching element, a variable resistive material formed on the lower electrode, and an upper electrode formed on the variable resistive material.

Typically, the PCRAM stores data by changing a crystalline state of the variable resistive material by current applied to the heater. In the PCRAM, the variable resistive material is controlled to have low resistance in a crystalline state and to have high resistance in an amorphous state.

In a write operation, heat generated in the variable resistive material is propagated to peripheral cells. Change in a resistance state in the peripheral cells by the generated heat is called a disturbance phenomenon.

FIGS. 1 and 2 are views illustrating the disturbance phenomenon in the general resistive memory device.

Referring to FIG. 1, a variable resistive material 105 and an upper electrode 109 are formed on an interlayer insulating layer 101 in which heaters 103A, 103B, and 103C are formed.

The crystalline state of the variable resistive material 105 is changed by heat generated in the heaters 103A, 103B, and 103C as access devices (not shown) below the heaters 103A, 103B, and 103C are accessed.

For example, it is assumed that cells positioned on the left heater 103A and the right heater 103B are written with a high resistance (an amorphous state). In this case, the memory cells connected the heaters 103A and 103B have sufficiently amorphized areas 107

At this time, when current is applied to the center heater 103C to write a cell connected to the heater 103C, the heat generated in the variable resistive material 105 by the heater 103C is transferred to adjacent cells and the crystalline states of the variable resistive materials 105 of the cells connected to the heaters 103A and 103B are changed.

Thus, as shown in FIG. 2, the variable resistive material on the heater 103C is normally amorphized (see 111 of FIG. 2), but amorphized areas 107A and 107B of the variable resistive material 105 connected to the heaters 103A and 103B are reduced to reduce resistance of a corresponding cell and thus the written data is distorted.

SUMMARY

According to one aspect of an exemplary embodiment, there is a provided a resistive memory device. The resistive memory device may include: a word line formed, in a first direction, on a semiconductor substrate; lower access structures, each having a pillar shape, formed on the word line; a first insulating layer formed around an outer circumference of each of the lower access structures; a heat-absorption layer formed around an outer circumference of the first insulating layer; a variable resistive material formed on each of the lower access structures; and an upper electrode formed on each variable resistive material.

According to another aspect of an exemplary embodiment, there is a provided a method of fabricating a resistive memory device. The method may include: forming a word line extending in a first direction on a semiconductor substrate; forming, at predetermined intervals, a plurality of lower access structures on the word line; forming a first insulating layer and a heat-absorption layer formed on an outer wall of the lower access structure; exposing an upper end of the lower access structure; and forming a variable resistive material and an upper electrode on the exposed lower access structure.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
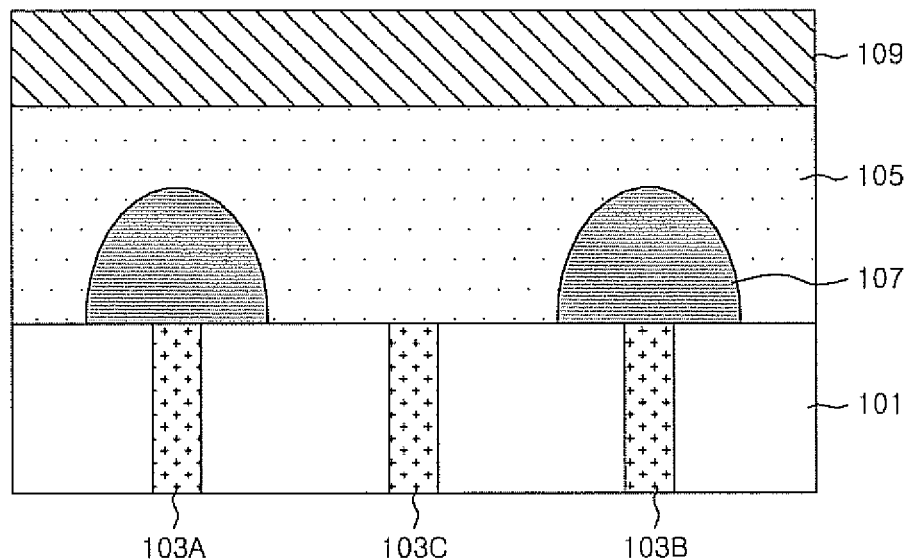
FIGS. 1 and 2 are views explaining a disturbance phenomenon in the general resistive memory device.
Figure 2:
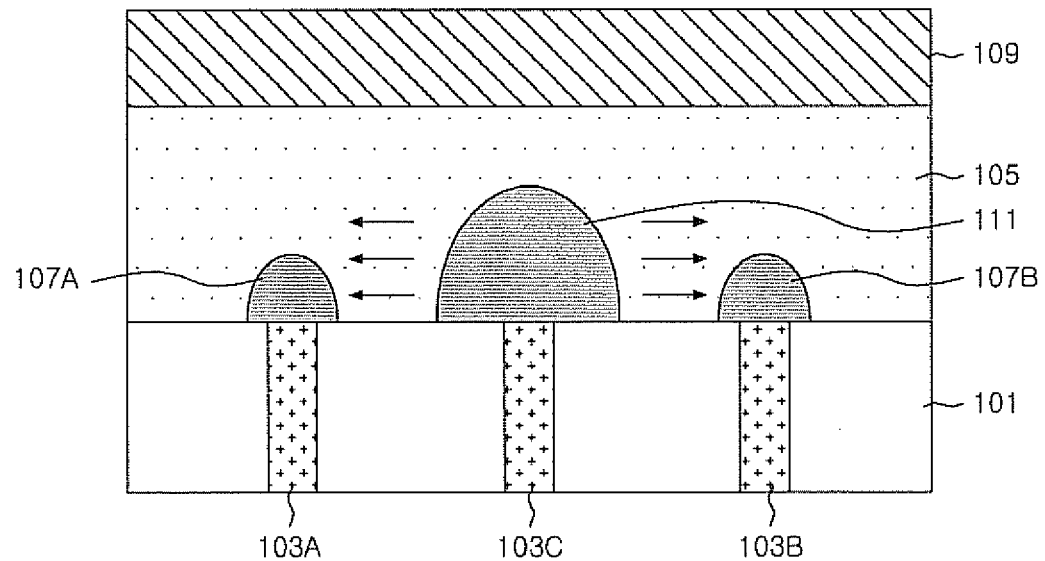

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 3:
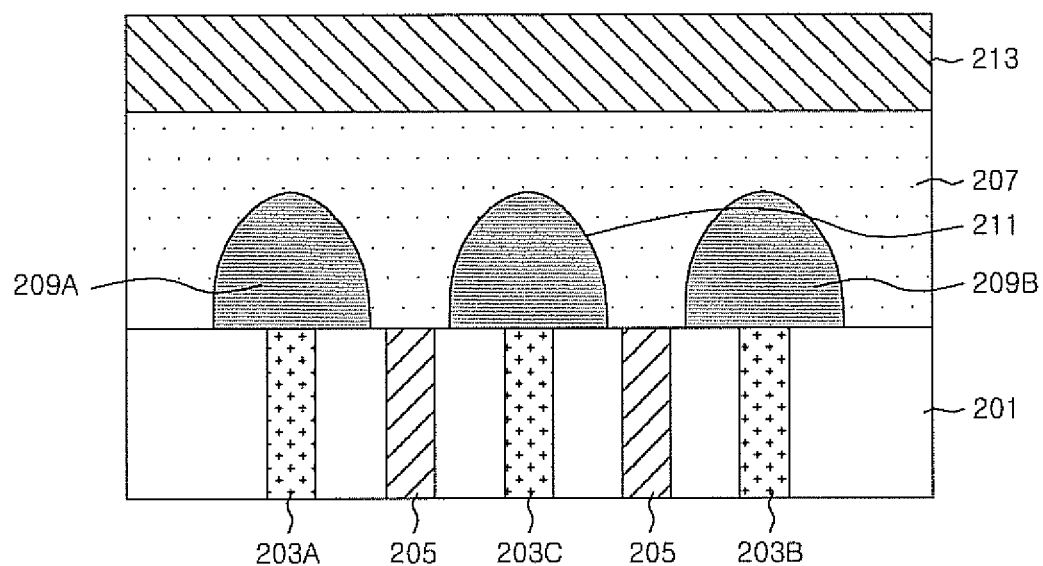
FIG. 3 is a view conceptually illustrating a resistive memory device according to an exemplary embodiment of the inventive concept.

FIG. 3 is a view conceptually illustrating a resistive memory device according to an exemplary embodiment.

In a resistive memory device of the exemplary embodiment, a heat-absorption layer is introduced to suppress disturbance between cells.

Referring to FIG. 3, the resistive memory device according to an exemplary embodiment includes heaters 203A, 203B, and 203C formed on a word line (not shown), an insulating layer 201 surrounding an outer circumference of the heaters 203A, 203B, and 203C in a predetermined thickness, a heat-absorption layer 205 surrounding an outer circumference of the insulating layer 201 in a predetermined thickness, and a variable resistive material 207 and an upper electrode 213 formed on the heaters 203A, 203B, and 203C.

In the resistive memory device, when cells, which are programmed in a high resistance state by the heaters 203A and 203B and have amorphized areas 209A and 209B corresponding to the heaters 203A and 203B, are present, disturbance is suppressed even when an adjacent cell is programmed by the heater 203C.

That is, heat, which is generated in the variable resistive material 207 when the variable resistive material 207 is heated by the heater 203C, is not transferred to the adjacent cells but exhausted to the heat-adsorption layer 205. Therefore, the heat does not affect the crystalline state of the variable resistive material 207 in the adjacent cells and a programming and read operation can be normally performed.

Accordingly, as shown in FIG. 3, without reduction of the amorphized area 209A and 209B formed in the variable resistive materials 207 on the heaters 203A and 203B, the amorphized area 211 is sufficiently formed in the variable resistive material 207 on the heater 203C and thus data having a high resistance state can be programmed.

FIGS. 4 to 8 are cross-sectional views illustrating a method of fabricating a resistive memory device according to an exemplary embodiment.

Figure 4:
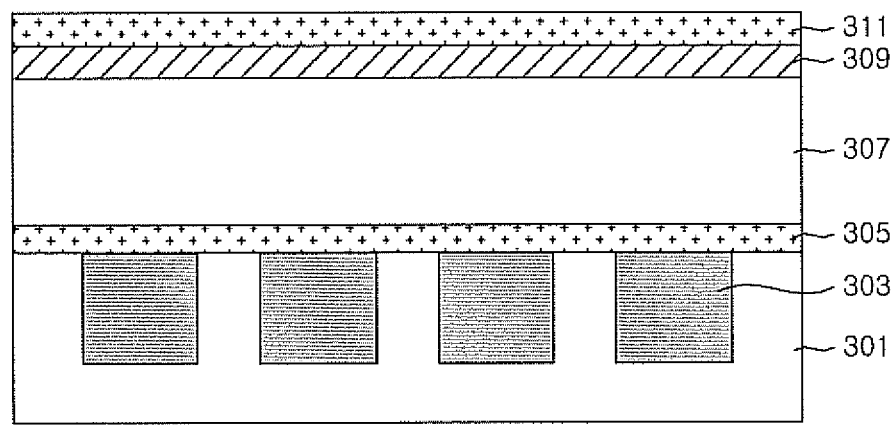
FIGS. 4 to 8 are views illustrating a method of fabricating a resistive memory device according to an exemplary embodiment of the inventive concept.

First, as shown in FIG. 4, a word line 303 is formed on a semiconductor substrate 301 in a first direction to have a predetermined width and depth. A first adhesion layer 305, a silicon layer 307, a second adhesion layer 309, and a heating material 311 are sequentially formed on an entire structure.

In one exemplary embodiment, a Schottky diode or a PN diode may be used as an access device. For example, the first adhesion layer 305 is formed as a barrier metal layer to form a Schottky barrier diode including the barrier metal layer and silicon layer 307. In another exemplary embodiment, ion implantation may be performed on the silicon layer 307 to form a PN diode. In this case, the first adhesion layer may be omitted. When the first adhesion layer is not omitted, the first adhesion layer 305 serves to stabilize an interface between the silicon layer 307 and the word line 303.

In addition, the second adhesion layer 309 may be omitted. When the second adhesion layer 309 is not omitted, the second adhesion layer 309 serves to reduce a contact resistance between the diode 305/307 or 307 and the heating material 311. The second adhesion layer 309 may be formed of a silicide layer. The second adhesion layer 309 may formed using a material such as cobalt (Co), titanium (Ti), nickel (Ni), tungsten (W), copper (Cu), sodium (Na), magnesium (Mg), or platinum (Pt). However, the second adhesion layer 309 is not limited thereto.

The heating material 311 serves to heat a variable resistive material that is to be formed in a subsequent process. The heating material may include at least one selected from the group consisting of metal, an alloy, metal oxynitride, an oxide electrode, and a conductive carbon compound. For example, the heating material may includes at least one selected from the group consisting of tungsten (W), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), platinum (Pt), titanium silicide (TiSi), tantalum silicide (TaSi), titanium tungsten (TiW), titanium oxynitride (TiON), titanium aluminum oxynitride (TiAlON), tungsten oxynitride (WON), tantalum oxynitride (TaON), and iridium oxide (IrO2).

Figure 5:
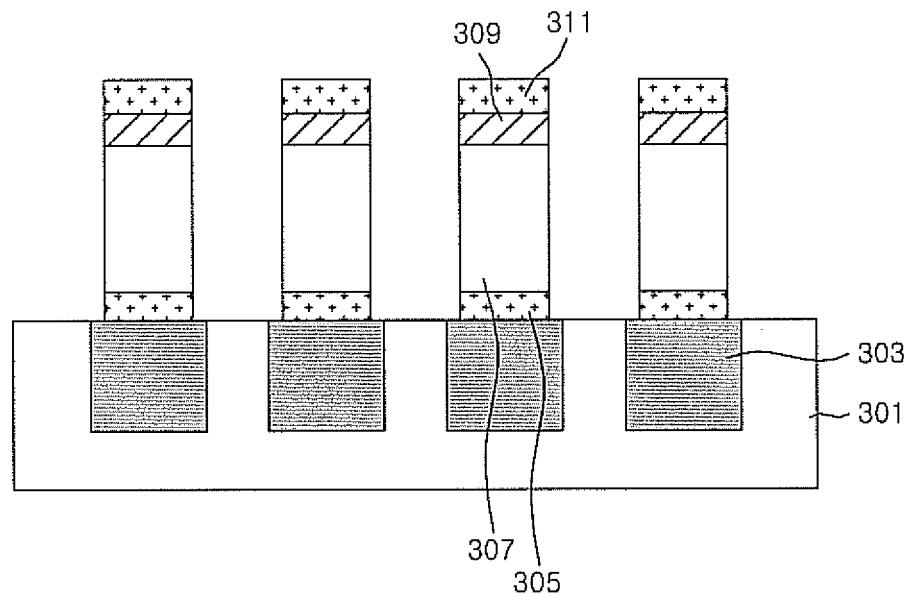

FIG. 5 illustrates a state in which a lower access structure having a pillar shape is formed on the word line 303. That is, the heating material 311, the second adhesion layer 309, the silicon layer 307, and the first adhesion layer 305 are patterned to form the pillar-shaped lower access structure on the word line 303. Therefore, each of structures having a pillar shape serves as the lower access structure of each of memory cells.

Figure 6:
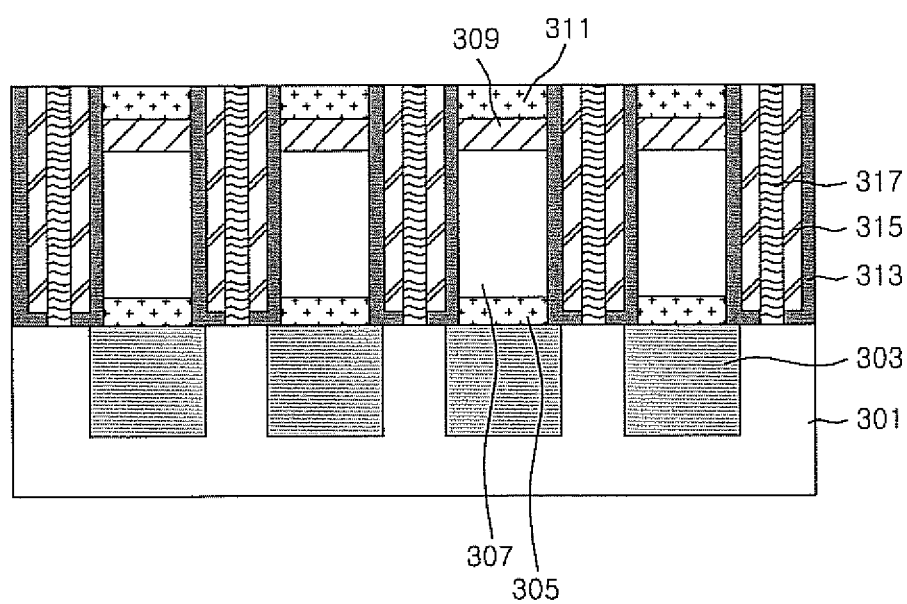

Subsequently, as shown in FIG. 6, a first insulating layer 313 and a heat-absorption layer 315 are formed on an entire structure. At this time, the first insulating layer 313 and the heat-absorption layer 315 may be formed to have thicknesses in which the first insulating layer 313 and the heat-adsorption layer 315 are not completely buried within a space between the pillar-shaped structures. However, the thicknesses of the first insulating layer 313 and the heat-absorption layer 315 is not limited thereto. Here, the first insulating layer 313 is formed to be insulated between the access device 305/307 or 307 and the heat-absorption layer 315.

The first insulating layer 313 and the heat-absorption layer 315 remain only on an outer wall of the pillar-shaped structure through a spacer etching process so that adjacent cells are not electrically connected to each other by the heat-absorption layer.

Then, a second insulating layer 317 is formed and then planarized to expose an upper end of the heating material 311, so that insulation between cells is obtained.

In this exemplary embodiment, the heat-absorption layer 315 may include at least one selected from the group consisting of metal, an alloy, metal oxynitride, an oxide electrode, and a conductive carbon compound. For example, the heat-absorption layer 315 may include any one selected from the group consisting of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, Pt, TiSi, TaSi, TiW, TiON, TiAlON, WON, TaON, and $IrO_2$, but it is not limited thereto.

Figure 7:
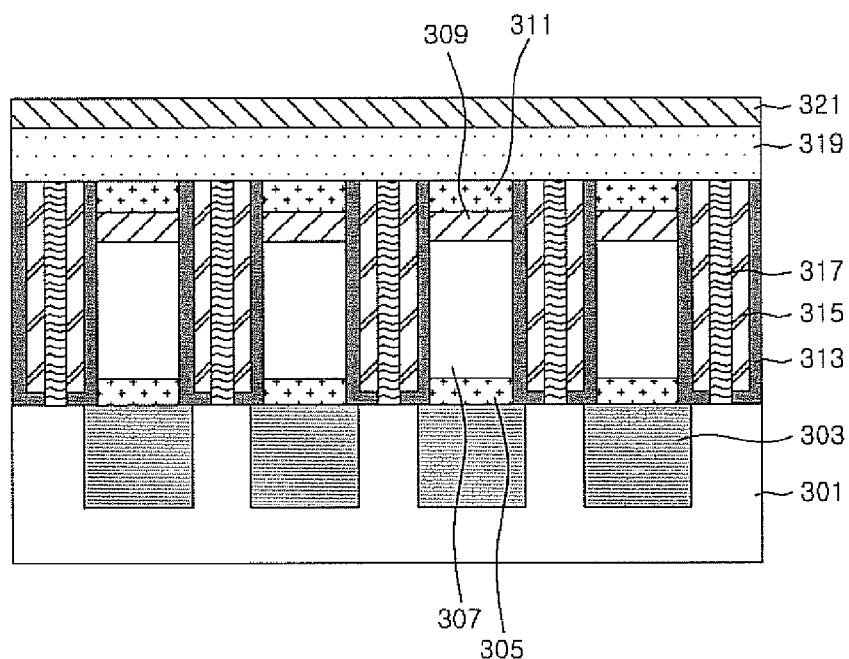
Figure 8:
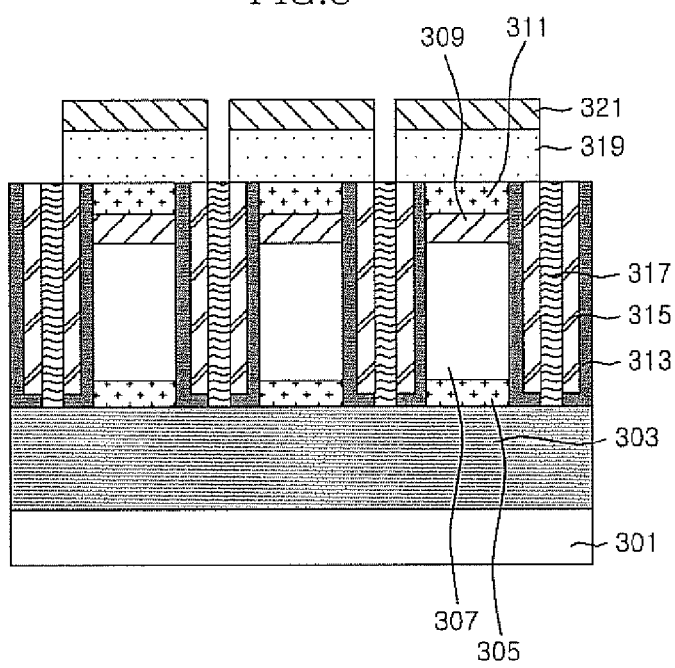

FIG. 7 illustrates a state in which a variable resistive material 319 and an upper electrode 321 are formed on an entire structure formed as in FIG. 6. FIG. 8 is a cross-sectional view in which the upper electrode 321 and the variable resistive material 319 are patterned in a direction perpendicular to the word line, that is, in a bit line direction when viewed in the bit line direction.

The upper electrode 321 and the variable resistive material 319 are line-patterned so that the upper electrode 321 and the variable resistive material 319 are controlled to have widths to cover the heat-absorption layer 315 at both sides of the access device, but the widths thereof is not limited thereto. It is preferable that the variable resistive material 319 be patterned to be formed at least on the heating material 311.

In addition, the upper electrode 321 itself may serve as a bit line.

The variable resistive layer 319 may include a material selected from the group consisting of tellurium (Te), selenium (Se), germanium (Ge), antimony (Sb), bismuth (Bi), lead (Pb), tin (Sn), arsenic (As), sulfur (S), silicon (Si), phosphorous (P), oxygen (O), nitrogen (N), a compound thereof, and an ally thereof. In this exemplary embodiment, the variable resistive material 319 may include a combination of Ge, Sb, and Te to have a high crystallization temperature or a combination of Bi, Te, Se, and Sb to have a low crystallization temperature.

As described above, the resistive memory device according to an exemplary embodiment include the word line 303 formed in the first direction, the access device 305/307 or 307 and the heating material 311 formed in the pillar shape on the word line, and the variable resistive material 319 and the upper electrode 321 formed on the heating material in the second direction. The outer circumference of the pillar-shaped structure including the access device and the heating material is surrounded by the heat-absorption layer 315 so that the structure is insulated from heat-absorption layer by the first insulating layer 313.

Therefore, when a specific cell is selected by the access device 305/307 or 307, and the variable resistive material 319 of the selected cell is heated by the heating electrode 311, the heat emitted from the variable resistive material 319 is not transferred to the adjacent cells but emitted to and absorbed in the heat-absorption layer 315.

Figure 9:
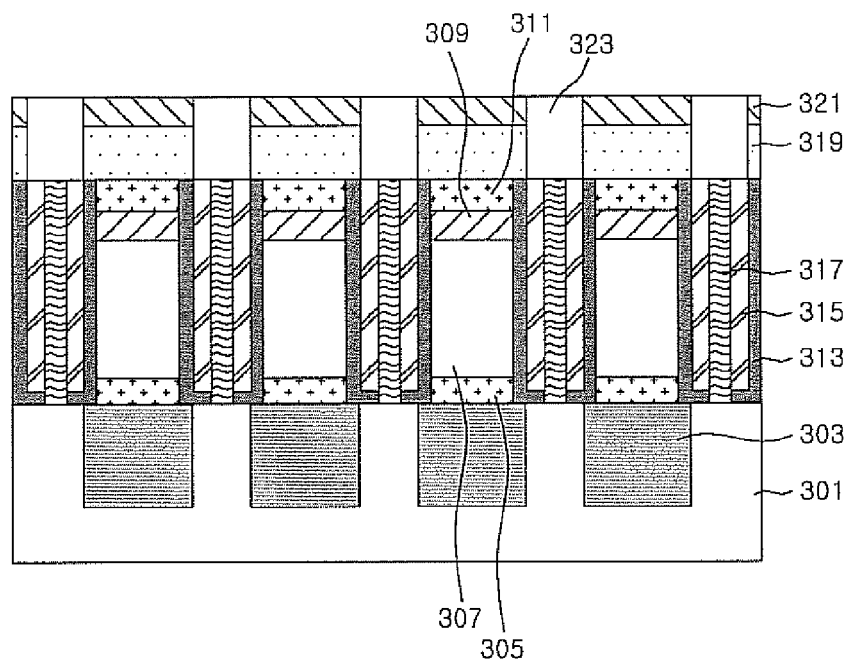
FIGS. 9 and 10 are views illustrating a resistive memory device according to another exemplary embodiment of the inventive concept.
Figure 10:
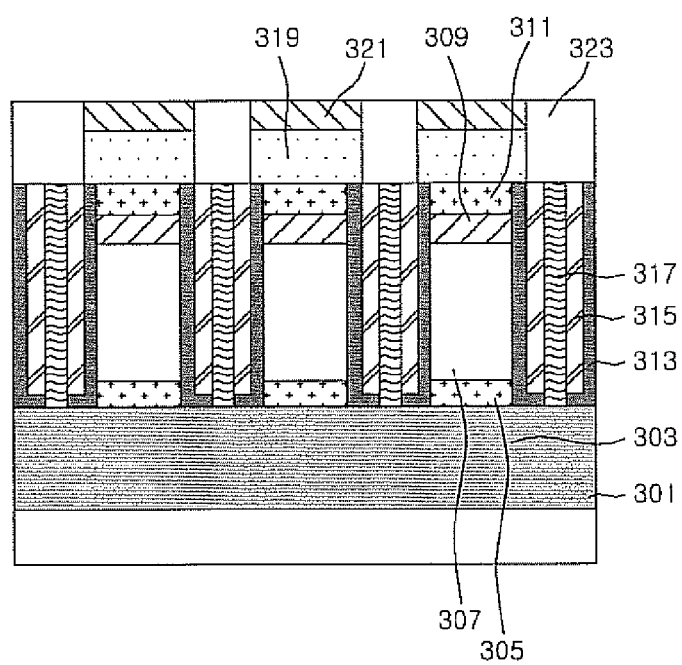

FIGS. 9 and 10 are cross-sectional views illustrating a resistive memory device according to another exemplary embodiment, wherein FIG. 9 is a cross-sectional view when viewed in a word line direction and FIG. 10 is a cross-sectional view when viewed in a bit line direction.

The resistive memory device according to this exemplary embodiment is similar to the resistive memory device illustrated in FIGS. 7 and 8 except that the variable resistive material 319 and the upper electrode are patterned in a word line direction as shown in FIG. 9 so that an overall of the cell is configured to have a pillar shape. In addition, FIG. 9 illustrates a case in which a resultant structure after the variable change material 319 and the upper electrode 321 are patterned in the pillar shape does not cover the heat-absorption layer 315 and is formed on the heating material 311. The reference numeral 323 denotes a third insulating layer that is buried after the variable resistive material 319 and the upper electrode 321 are patterned in the pillar shape.

In addition to introduction of the heat-absorption layer 315 on an outer side of the lower access structure including the access device and the heating electrode, the variable resistive material 319 and the upper electrode 321 are patterned in the pillar shape so that thermal conductivity through the bit line can be prevented. Therefore, the disturbance between the cells can be more effectively suppressed.

Figure 11:
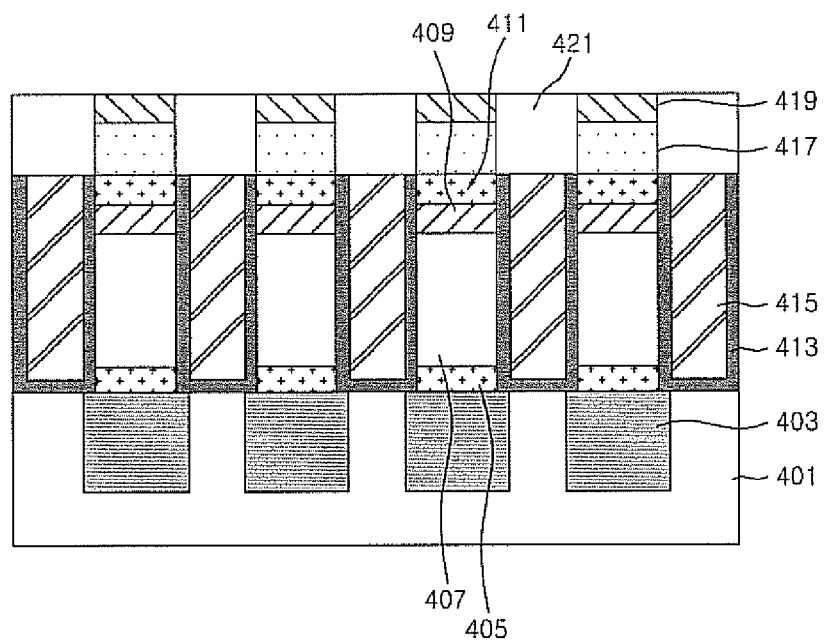
FIGS. 11 and 12 are views illustrating a resistive memory device according to another exemplary embodiment of the inventive concept.
Figure 12:
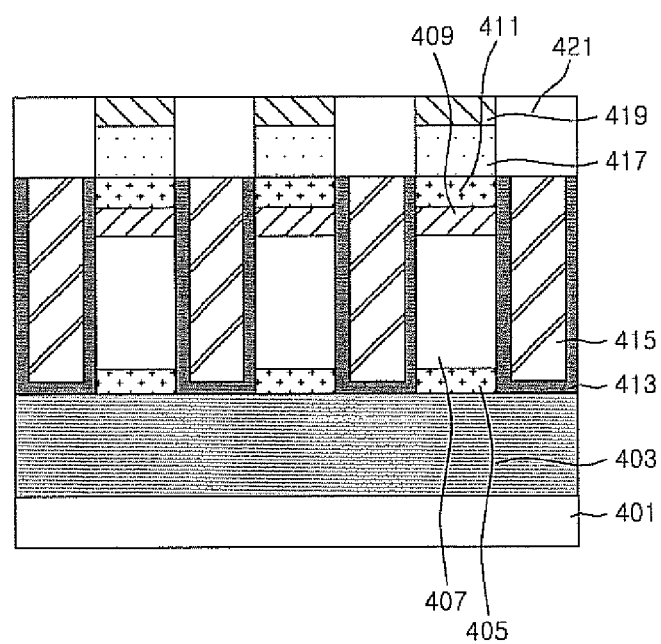

FIGS. 11 and 12 are cross-sectional views illustrating a resistive memory device according to another exemplary embodiment, wherein FIG. 11 is a cross-sectional view when viewed in a word line direction and FIG. 12 is a cross-sectional view when viewed in a bit line direction.

Pillar-shaped lower access structures of which each structure includes a first adhesion layer 405, a silicon layer 407, a second adhesion layer 409, and a heating material 411 are formed on a semiconductor substrate 401 on which a word line 403 is formed. The first adhesion layer serves as a barrier metal layer and may form a Schottky diode with the silicon layer 407. Ion implantation may be performed on the silicon layer 407 to form a PN diode regardless of forming the first adhesion layer 405. The second adhesion layer 409 may include a silicide layer and when the second adhesion layer 409 is formed, a contact resistance between the access device 405/407 or 407 and heating material 411 can be reduced.

A first insulating layer 413 is formed on an entire structure on which the pillar-shaped lower access structures 405, 407, 409, and 411 are formed and a heat-absorption layer 415 is buried in a space between the lower access structures 405, 407, 409, and 411 and then planarization is performed on the first insulating layer 413 and the heat-absorption layer to expose an upper end of the heating material 411.

Therefore, the heat-absorption layer 415 is formed on an outer wall of each of the lower access structure 405, 407, 409, and 411 to be insulated from each of the lower access structure 405, 407, 409, and 411 by the first insulating layer 413.

A variable resistive material 417 and an upper electrode 419 are formed on an entire structure and patterned in a pillar shape to be in contact with the heating material 411, and then a second insulating layer 421 is buried in a portion in which the variable resistive material 411 and the upper electrode 419 are removed.

In the exemplary embodiment, the heat-absorption layer 415 is buried between the lower access structures 405, 407, 409, and 411 to be insulated from the lower access structures by the first insulating layer 413.

Therefore, the variable material 417 and the upper electrode 419 have to be patterned in the pillar shape to prevent bridge between adjacent cells. Further, the variable resistive material 417 and the upper electrode 419 are patterned to positioning only on the heating material 411.

In this exemplary embodiment, since the heat-absorption layer 415 is formed to have a sufficient thickness, the disturbance between cells can be suppressed as small as possible.

Figure 13:
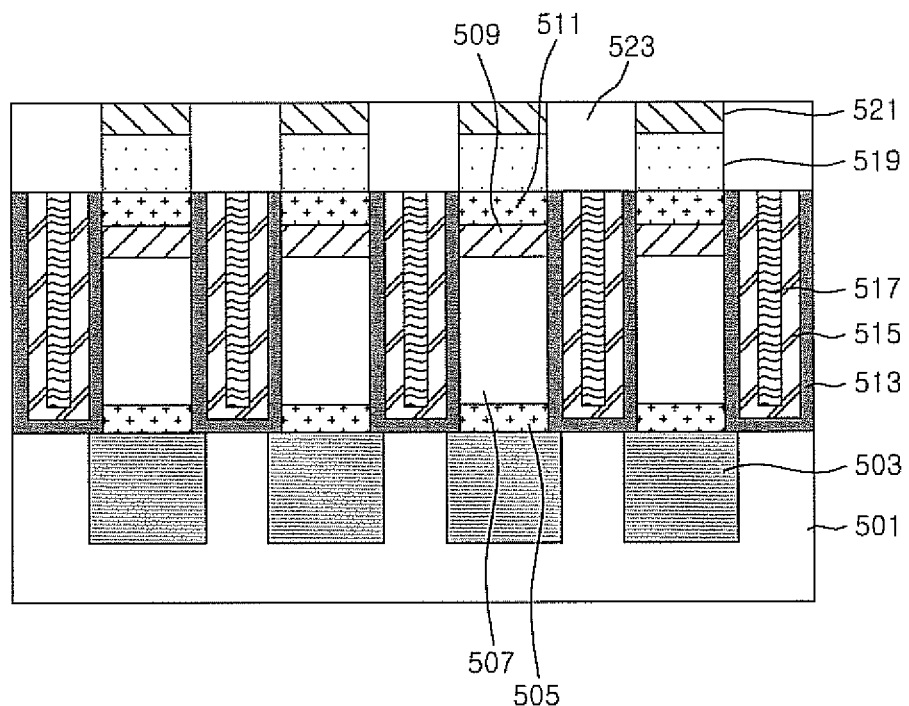
FIGS. 13 and 14 are views illustrating resistive memory devices fabricated according to another exemplary embodiment of the inventive concept.
Figure 14:
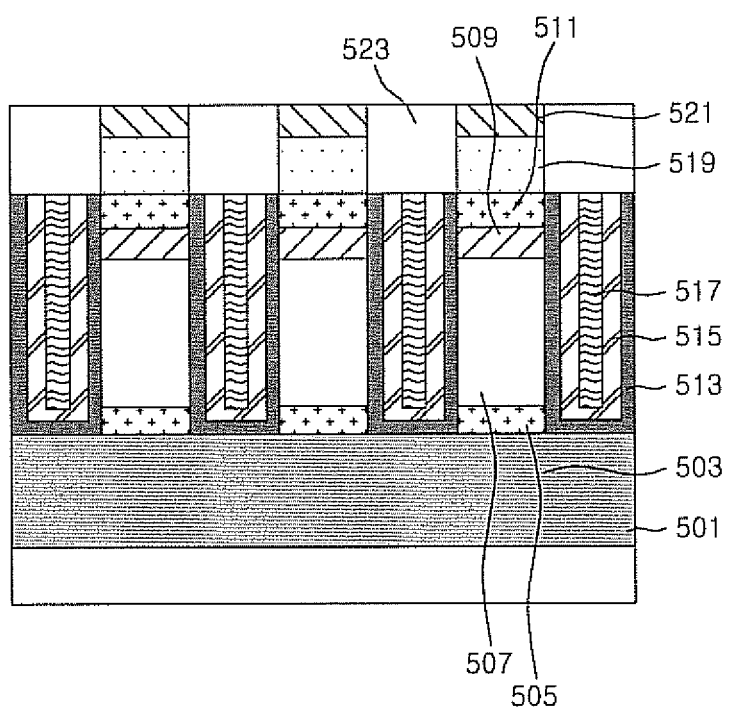

FIGS. 13 and 14 are cross-sectional views illustrating a resistive memory device fabricated according to another aspect, wherein FIG. 13 is a cross-sectional view when viewed in a word line direction and FIG. 14 is a cross-sectional view when viewed in a bit line direction.

Pillar-shaped lower access structures of which each including a first adhesion layer 505, a silicon layer 507, a second adhesion layer 509, and a heating material 511 are formed on a semiconductor substrate 501 in which a word line 503 is formed. As an access device, a Schottky barrier diode including the first adhesion layer 505 serving as a barrier metal layer and the silicon layer 507 may be used. Alternatively, ion implantation is performed on the silicon layer 507 to form a PN diode as the access device regardless of forming the first adhesion layer 505. The second adhesion layer 509 may include a silicide layer. When the second adhesion layer 509 is formed, a contact resistance between the access device 505/507 or 507 and the heating material 511 can be reduced.

Subsequently, a first insulating layer 513, a heat-absorption layer 515, and a second insulating layer 517 are sequentially formed on an entire structure in which the pillar-shaped lower access structures 505, 507, 509, and 511 are formed and then planarized to expose an upper end of the heating material 511.

Therefore, an outer wall of each of the lower access structures 505, 507, 509, and 511 is surrounded by the first insulating layer 513, the heat-absorption layer 515, and the second insulating layer 517.

Then, a variable resistive material 519 and an upper electrode 521 are formed on an entire structure and then patterned in a pillar shape to be in contact with the heating material 511, and a third insulating layer 523 is buried in a portion in which the variable resistive material 519 and the upper electrode 521 are removed.

In the resistive memory device according to this exemplary embodiment, the second insulating layer 517 is formed without a spacer etching process for the first insulating layer 513 and the heat-absorption layer 515 unlike the resistive memory device described in FIGS. 4 to 8. Therefore, a thickness of the absorption layer 515 is more safely ensured.

As the spacer etching process is omitted, the variable resistive material 519 and the upper electrode 521 have to be patterned in the pillar shape and patterned to positioning only on the heating material 511.

As described above, in the exemplary embodiments, an outer circumference of each of the lower access structures (diodes and heating materials) is covered with the heat-absorption layer so that heat generated when heat is applied to a selected cell is not conducted to adjacent cells but is absorbed in the heat-absorption layer.

Further, thermal conduction can be further prevented by patterning the variable resistive material and the upper electrode in the pillar shape.

The above-described exemplary embodiments have illustrated various structures for the lower access structure and the heat-absorption layer surrounding the lower access structure and various structures of the variable resistive material and the upper electrode. However, the inventive concept is not limited by the detailed description and the accompanying drawings and any structure, in which heat generated in the variable resistive material can be absorbed by the heat-absorption layer formed to surround the lower access structure, may be employed.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A resistive memory device, comprising:
   a word line formed, in a first direction, on a semiconductor substrate;
   lower access structures, each having a pillar shape, formed on the word line;
   a first insulating layer formed around an outer circumference of each of the lower access structures;
   a heat-absorption layer formed around an outer circumference of the first insulating layer;
   a variable resistive material formed on each of the lower access structures; and
   an upper electrode formed on each variable resistive material.

2. The resistive memory device of claim 1, further comprising a second insulating layer formed on the semiconductor substrate to surround an outer circumference of the heat-absorption layer and to insulate adjacent lower access structures from each other.

3. The resistive memory device of claim 2, wherein the variable resistive material and the upper electrode are patterned in a second direction perpendicular to the first direction.

4. The resistive memory device of claim 2, wherein the variable resistive material and the upper electrode are patterned to have a pillar shape extending from each of the lower access structures.

5. The resistive memory device of claim 1, wherein the heat-absorption layer is located between adjacent lower access structures.

6. The resistive memory device of claim 5, wherein the variable resistive material and the upper electrode are patterned to have a pillar shape extending from each of the lower access structures.

7. The resistive memory device of claim 6, wherein the variable resistive material and the upper electrode are formed only on the lower access structures.

8. The resistive memory device of claim 1, wherein the first insulating layer is extended from bottom of the adjacent lower access structures,
   the resistive memory device further comprising a second insulating layer formed to surround an outer circumference of the heat-absorption layer.

9. The resistive memory device of claim 8, wherein the variable resistive material and the upper electrode are patterned to have a pillar shape extending from each of the lower access structures.

10. The resistive memory device of claim 9, wherein the variable resistive material and the upper electrode are formed only on the lower access structures.

11. The resistive memory device of claim 1, wherein each of the lower access structure includes:
    a switching element electrically connected to the word line; and
    a heating material interposed between the switching element and the variable resistive material.

12. A method of fabricating a resistive memory device, the method comprising:
    forming a word line extending a first direction on a semiconductor substrate;
    forming, at predetermined intervals, a plurality of lower access structures on the word line;
    forming a first insulating layer and a heat-absorption layer on an outer wall of each of the lower access structures;
    exposing an upper end of each of the lower access structures; and
    forming a variable resistive material and an upper electrode on each exposed lower access structure.

13. The method of claim 12, wherein the exposing includes:
    sequentially forming the first insulating layer and the heat-absorption layer on the semiconductor substrate and the lower access structures;
    spacer-etching the first insulating layer and the heat-absorption layer;
    forming a second insulating layer on an entire structure between adjacent lower access structures; and
    planarizing the second insulating layer to expose the upper end of each of the lower access structures.

14. The method of claim 13, wherein forming the variable resistive material and the upper electrode further comprises:
    patterning the variable resistive material and the upper electrode in a second direction perpendicular to the first direction.

15. The method of claim 13, wherein forming the variable resistive material and the upper electrode further comprises:
    patterning the variable resistive material and the upper electrode to have a pillar shape extending from each of the lower access structures.

16. The method of claim 12, wherein exposing the upper end of each of the lower access structures further comprises:
    forming the first insulating layer on the semiconductor substrate and the lower access structures;

forming the heat-absorption layer on the first insulating layer between adjacent lower access structures; and planarizing the heat-absorption layer and the first insulating layer to expose the upper end of each of the lower access structures.

17. The method of claim 16, wherein forming the variable resistive material and the upper electrode further comprises:

patterning the variable resistive material and the upper electrode to have a pillar shape extending from each of the lower access structures.

18. The method of claim 17, wherein the variable resistive material and the upper electrode are patterned to be located only on the lower access structures.

19. The method of claim 12, wherein exposing the upper end of each of the lower access structures further comprises:

sequentially forming the first insulating layer, the heat-absorption layer, and the second insulating layer on the semiconductor substrate and the lower access structures; and planarizing the first insulating layer, the heat-absorption layer, and the second insulating layer to expose the upper end of each of the lower access structures.

20. The method of claim 19, wherein forming the variable resistive material and the upper electrode further comprises:

patterning the variable resistive material and the upper electrode to have a pillar shape extending from each of the lower access structures.

21. The method of claim 20, wherein the variable resistive material and the upper electrode are patterned to be located only on the lower access structures.

22. The method of claim 12, wherein forming the plurality of lower access structures includes:

forming a switching element and a heating material on the word line; and patterning the switching element and the heating material to have a pillar shape.

* * * * *